United States Patent [19]

Pagnamenta

[11] 4,350,958
[45] Sep. 21, 1982

[54] IMPEDANCE MATCHING CIRCUITRY FOR RADIO FREQUENCY SIGNAL POWER AMPLIFIERS

[75] Inventor: Antonio Pagnamenta, Schaumburg, Ill.

[73] Assignee: Motorola, Inc., Schaumburg, Ill.

[21] Appl. No.: 112,765

[22] Filed: Jan. 17, 1980

[51] Int. Cl.$^3$ .............................................. H03F 3/04
[52] U.S. Cl. ...................................... 330/286; 333/33
[58] Field of Search .................... 330/53, 57, 56, 286 330/287; 333/33, 34, 128

[56] References Cited

U.S. PATENT DOCUMENTS 3,419,813  12/1968  Kamnitsis ........................ 333/34 X
4,013,974  3/1977  Quine ............................... 330/53 X

FOREIGN PATENT DOCUMENTS 54-101648  8/1979  Japan .................................. 330/286

OTHER PUBLICATIONS

Kalinikos, "Wideband Transistorized Power Amplifier of the Microwave Band", *Instru. & Exp. Tech.*, vol. 20, No. 1, PT2, Jan.-Feb. 1977, pp. 161-162.

*Primary Examiner*—James B. Mullins
*Attorney, Agent, or Firm*—Rolland R. Hackbart; James W. Gillman

[57] ABSTRACT

Impedance matching circuitry is described that utilizes a plurality of series coupled microstrip transmission lines of different characteristic impedances for matching a radio frequency (RF) signal power amplifier to a predetermined output impedance, such as, for example, 50 ohms. Each of the microstrip transmission lines are successively coupled to the relatively low impedance output of a transistor of the power amplifier that is desired to be matched to the predetermined output impedance. Each of the successively coupled microstrip transmission lines has a greater characteristic impedance than the previously coupled microstrip transmission line for achieving the desired impedance match. The series coupled microstrip transmission lines not only match the power amplifier transistor to the predetermined output impedance, but also suppress regenerative oscillations which may occur when the power amplifier transistor is subjected to impedance mismatches. The inventive impedance matching circuitry may be advantageously utilized in the RF signal power amplifier of a base station radio in a mobile radio communication system.

6 Claims, 6 Drawing Figures

IMPEDANCE MATCHING CIRCUITRY FOR RADIO FREQUENCY SIGNAL POWER AMPLIFIERS

RELATED APPLICATIONS

The instant application is related to copending application Ser. No. 112,771 entitled "Radio Frequency Signal Power Amplifier", invented by Thomas W. Hull and Antonio Pagnamenta and assigned to the same assignee, and filed the same date, as the instant application.

BACKGROUND OF THE INVENTION

The present invention relates generally to radio frequency (RF) signal power amplifiers, and more particularly to an improved impedance matching circuitry for RF signal power amplifiers utilizing microstrip transmission line techniques.

In prior art RF signal power amplifiers utilizing microstrip transmission line techniques, impedance matching is typically accomplished by utilizing capacitive or inductive stubs located at predetermined distances from the amplifying devices for terminating the amplifying device with a predetermined output impedance. The location of the capacitive and inductive stubs may be determined by utilizing conventional transmission line techniques, such as, for example, the single-stub matching techniques described on pages 94–96 of the text, "Transmission Lines and Wave Propagation," written by Philip C. Magnusson and published by Allyn and Bacon, Inc., 1965. These stubs are spacially located at right angles to the transmission line and are electrically coupled in parallel with the transmission line. In addition, two or more such stubs may be connected opposite one another in a wing-like arrangement. Furthermore, the pair of stubs need not be at right angles with respect to the transmission line. Pairs of such stubs, commonly referred to as "capacitance wings" have been utilized in Motorola Instruction Manual No. 68P81030E10, entitled "Cell Site RF Power Amplifier," published by Motorola Service Publications, Motorola, Inc., Schaumburg, Ill. 1975.

These stubs may be added to the output microstrip circuitry of an RF signal power amplifier for impedance matching transistors of the amplifier to a predetermined output impedance in order to avoid excessive standing voltage and current waves due to impedance mismatches. Such impedance mismatches can result from tolerance variations encountered in the manufacture of the microstrip circuitry of RF signal power amplifiers and from failures in succeeding amplifying stages. When subjected to impedance mismatches, transistors in RF signal power amplifiers may become unstable and regeneratively oscillate. The spurious signals created by such regenerative oscillations produce undesirable interference on the amplified RF signal. When subjected to impedance mismatches, the foregoing stub matching techniques do not adequately suppress the spurious signals resulting from such regenerative oscillations of the amplifier transistors. Thus, there has been a long felt need for improved impedance matching circuitry for RF signal power amplifiers that prevents regenerative oscillations when the amplifying devices are terminated by impedance mismatches.

SUMMARY OF THE INVENTION

Accordingly, it is an object of the present invention to provide improved impedance matching circuitry for RF signal power amplifiers that provides stable amplifier operation when the amplifier is subjected to impedance mismatches.

It is another object of the present invention to provide improved impedance matching circuitry for RF signal power amplifiers that introduces minimal losses while providing broadband impedance matching and the suppression of regenerative oscillatory modes.

In practicing the present invention, impedance matching circuitry is provided for matching the output of an RF signal power amplifier to a predetermined output impedance. The impedance matching circuitry includes a substrate having first and second surfaces, where the second surface is plated with a conductive substance for providing a ground plane. The impedance matching circuitry further includes a plurality of series coupled microstrip transmission lines disposed on the first surface of the substrate. The series coupled microstrip transmission lines are further coupled to the output of the amplifier for matching the output of the amplifier to the predetermined output impedance. Furthermore, each of the microstrip transmission lines has a different predetermined characteristic impedance from the others, and each microstrip transmission line successively coupled in series to the output of the amplifier has a greater predetermined characteristic impedance than the previously coupled microstrip transmission line. Thus, successively greater characteristic impedances of the series coupled transmission lines match the output of the RF signal amplifier to the predetermined output impedance. The series coupled transmission lines provide a broadband, low loss and stable match to the output of the RF signal amplifier. In this manner, the impedance matching circuitry prevents the RF signal amplifier from undergoing regenerative oscillations when terminated by an impedance mismatch.

BRIEF DESCRIPTION OF THE DRAWINGS

FIGS. 3A and 3B, when arranged together, are a plan view of the microstrip transmission line circuitry and electrical circuit components in the final amplifiers 120 and 122 in FIG. 1.

DETAILED DESCRIPTION OF THE PREFERRED EMBODIMENT

Figure 1:
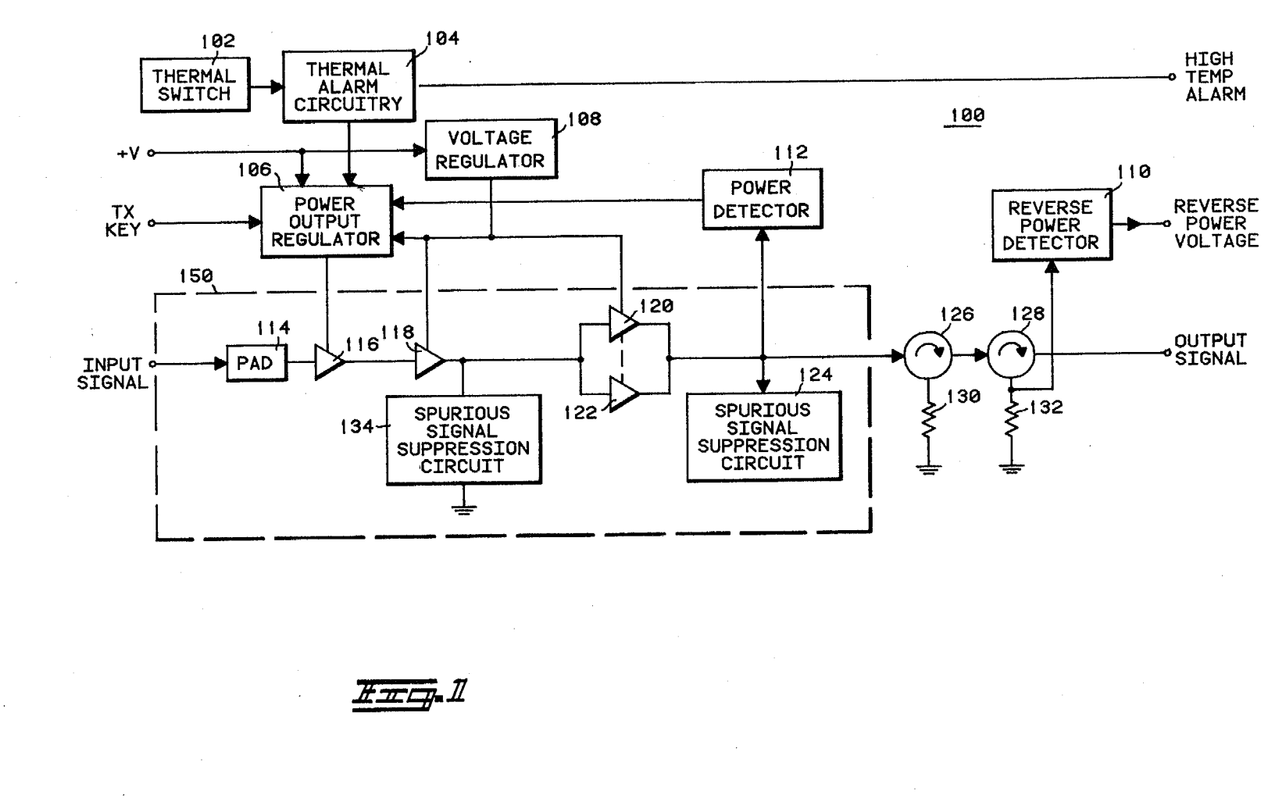
FIG. 1 is a general block diagram of an RF signal power amplifier that may advantageously utilize the present invention.

In FIG. 1, there is illustrated an RF signal power amplifier 100 that may advantageously utilize the present invention. The amplifier 100 is adapted to receive an RF signal at its input and provide at its output the RF signal amplified by three stages of amplification in amplifying circuitry 150. Amplifying circuitry 150 includes microstrip transmission line circuitry (see FIGS. 2 and 3) for intercoupling the RF signal between the successive stages of amplification 116, 118 and 120 and 122, and is particularly well adapted for amplifying RF signals in the 800 to 900 MHz frequency range. Further details for each of the blocks in FIG. 1 are described in the aforementioned copending patent application, U.S. Ser. No. 112,771, 1-17-80, and in Motorola Instruction Manual No. 68P81041E10, entitled "Base Site RF Power Amplifier", published by Motorola, Inc., Schaumburg. Ill., 1979.

Figure 2A:
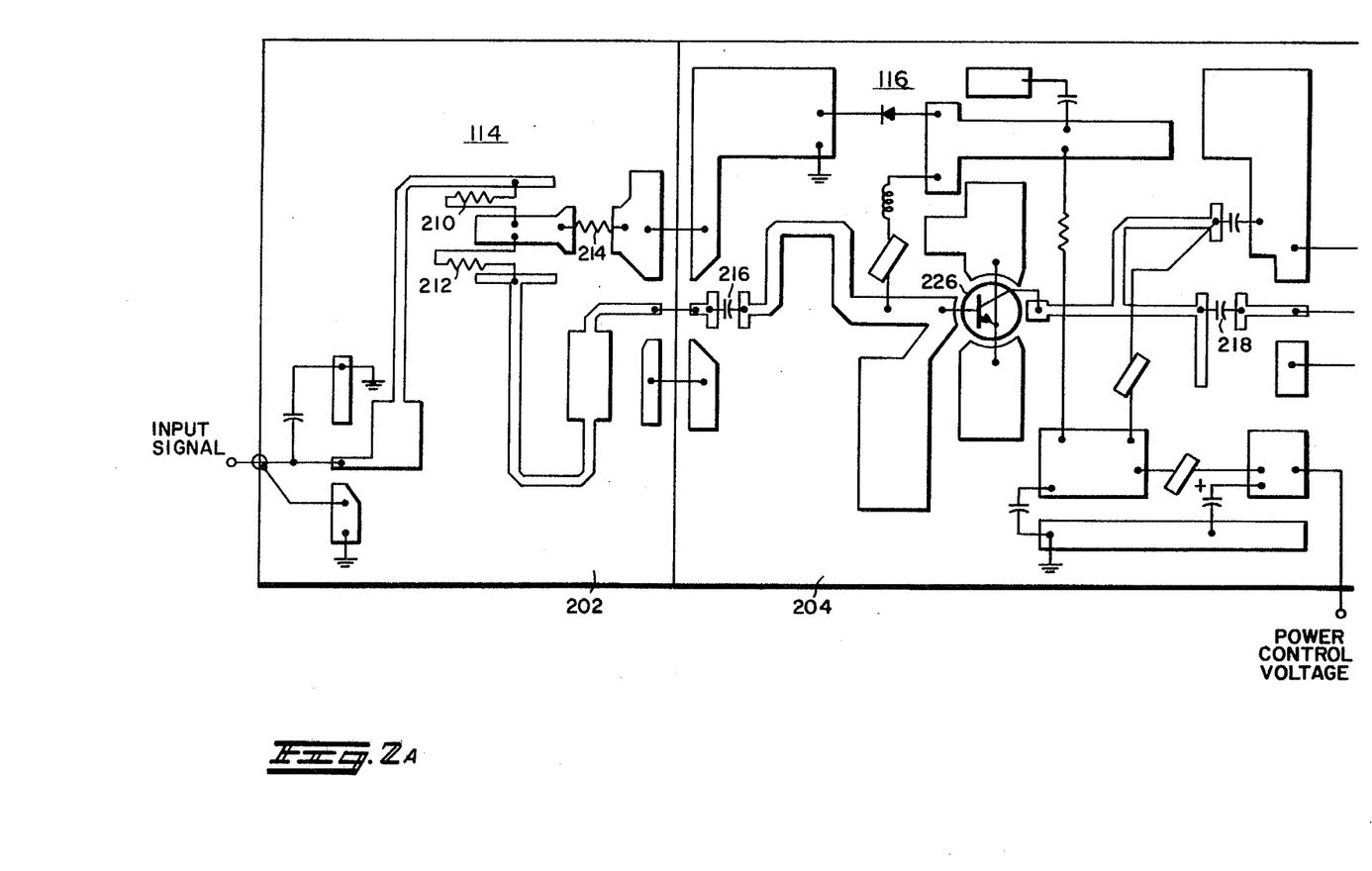
FIGS. 2A and 2B, when arranged together, are a plan view of the microstrip transmission line circuitry and electrical circuit components in the predriver amplifier 116 and driver amplifier 118 in FIG. 1.
Figure 2B:
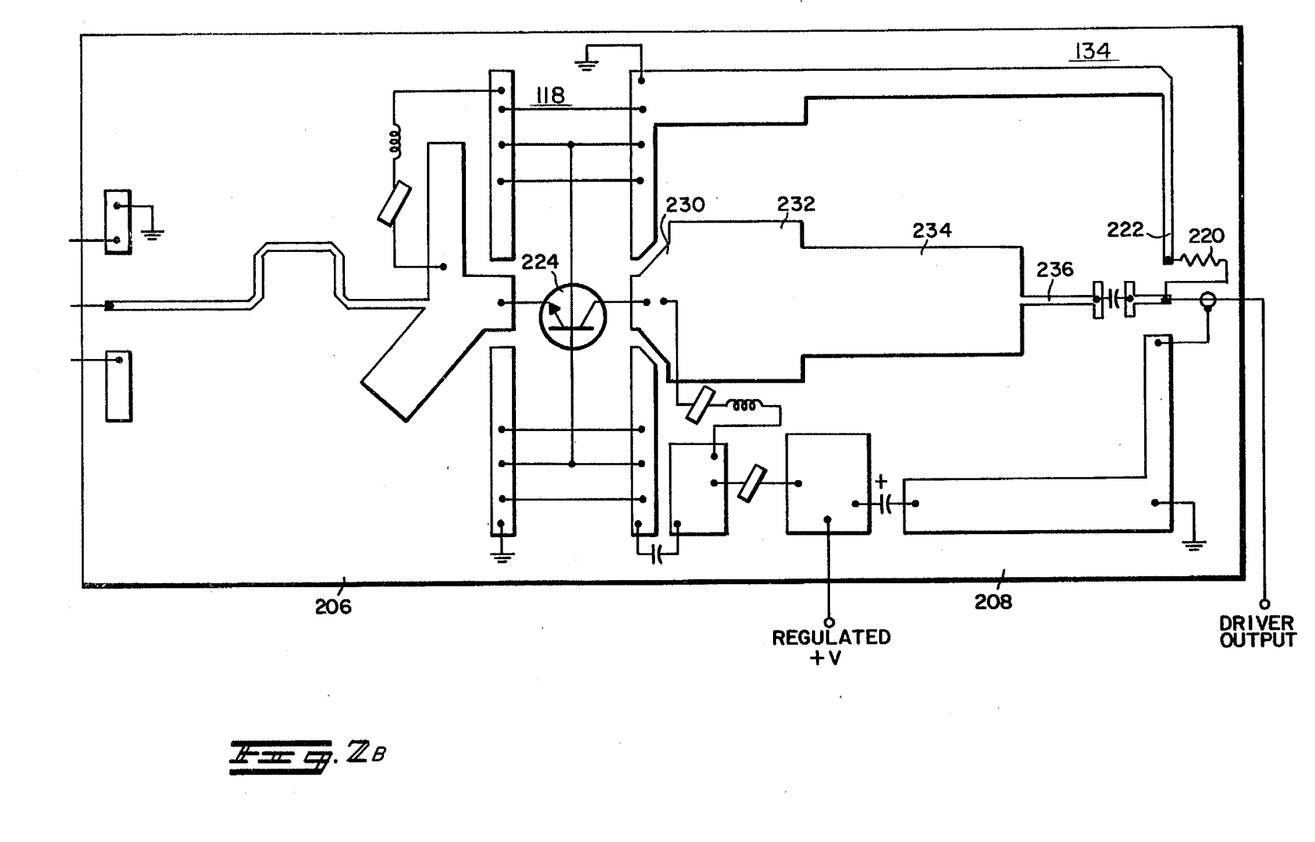

Referring to FIGS. 2A and 2B, there is illustrated in more detail the predriver amplifier 116 and driver amplifier 118 in FIG. 1 together with their corresponding microstrip coupling circuitry. The microstrip coupling circuitry in FIGS. 2A and 2B is provided on four alumina substrates 202, 204, 206 and 208, which may be strapped together when mounted to a suitable heat sink (not shown). Substrate 202 includes the circuitry for the T pad attenuator 114 in FIG. 1; substrate 204 includes the microstrip coupling circuitry and transistor 226 for the predriver amplifier 116 in FIG. 1; and substrates 206 and 208 include the microstrip coupling circuitry and transistor 224 for the driver amplifier 118 in FIG. 1.

Since each of the stages of amplification of the power amplifier 100 are intercoupled by microstrip transmission lines having a characteristic impedance of 50 ohms, impedance matching circuitry is necessary to match the relatively low impedance output of transistor 224 of the driver amplifier 118 to 50 ohms. In accordance with the present invention, transistor 224 of the driver amplifier 118 is impedance matched to a 50 ohm output impedance by series coupled microstrip transmission lines 230, 232, 234 and 236. The short microstrip transmission line 230 couples the collector of transistor 224 to microstrip transmission line 232, and microstrip transmission line 236 has a characteristic impedance of 50 ohms for coupling the driver output to succeeding stages. Microstrip transmission line 232 has a smaller characteristic impedance than, and is therefore wider than, microstrip transmission line 234. Similarly, microstrip transmission line 234 has a smaller characteristic impedance than, and is therefore wider than, microstrip transmission line 236. For example, in the preferred embodiment, microstrip transmission line 232 may have a characteristic impedance of 7.56 ohms, and microstrip transmission line 234 may have a characteristic impedance of 11.4 ohms. Each of these microstrip transmission lines 232 and 234 is less than one-fourth wavelength long at the midband frequency, and microstrip transmission line 234 is longer than microstrip transmission line 232.

A feature of the present invention is that the particular impedance matching circuitry utilizes presents less capacitive reactance and more resistance at the spurious signal frequencies than prior art matching circuits, which typically have added only capacitive reactance. Thus, the series coupled microstrip transmission lines 232 and 234 not only impedance match the output of transistor 224 to 50 ohms, but also provide a low loss and stable match when the output of transistor 224 is not loaded with 50 ohms. For example, transistor 224 will remain stable when subjected to a 3:1 mismatch. When subjected to such mismatches, amplifier transistors will typically regeneratively oscillate, creating undesirable spurious signals. For example, spurious signals having frequencies in the 10 to 50 MHz range may be generated by an 800 MHz RF signal power amplifier when it regeneratively oscillates. However, even when subjected to a 3:1 mismatch, the matching circuitry of the present invention suppresses regenerative oscillations in transistor 224, while maximizing the amount of power delivered by transistor 224 to the succeeding stage of amplification.

Figure 3B:
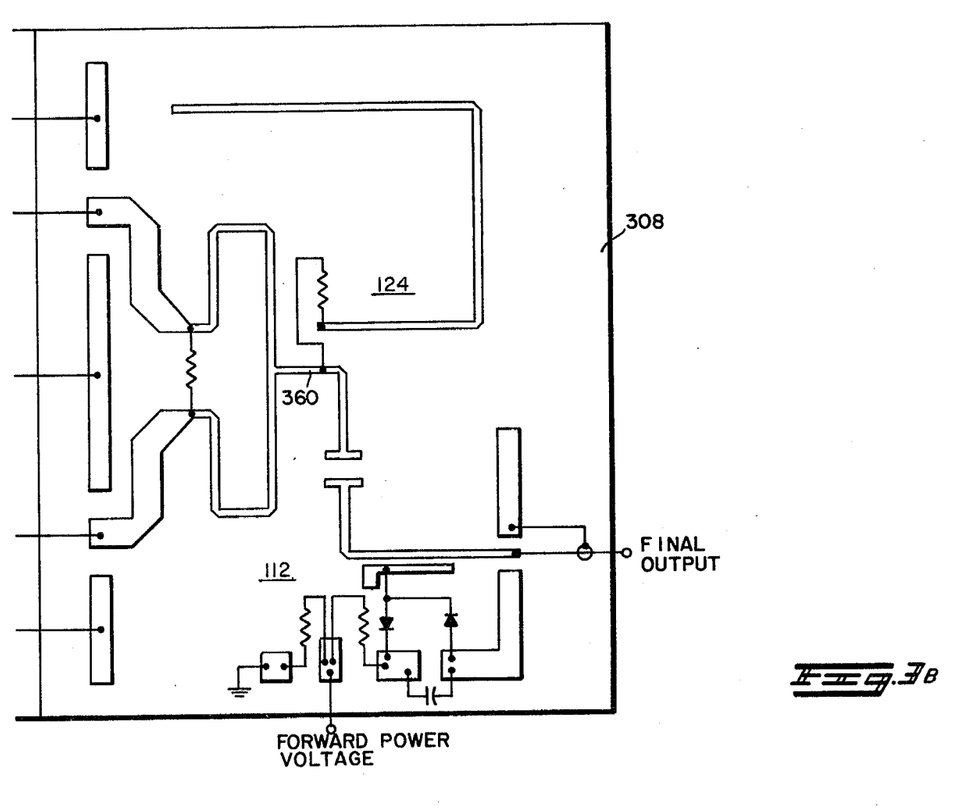

Referring to FIGS. 3A and 3B, there is illustrated the final amplifiers (see 120 and 122 in FIG. 1) together with their corresponding microstrip coupling circuitry. The microstrip coupling circuitry of FIGS. 3A and 3B includes three substrates 304, 306 and 308. The impedance matching circuitry of the present invention may likewise be utilized for matching final amplifier transistors 310 and 312 to a predetermined output impedance, which here is 25 ohms. Thus, the microstrip transmission lines 340, 342 and 344 match the output of transistor 310 to the 25 ohm characteristic impedance of the microstrip transmission line 346, and microstrip transmission lines 350, 352 and 354 likewise match the output of transistor 312 to the 25 ohm characteristic impedance of microstrip transmission line 356. Microstrip transmission lines 346 and 356 are thereafter symmetrically coupled to a 50 ohm microstrip transmission line 360 on substrate 308.

Figure 4:
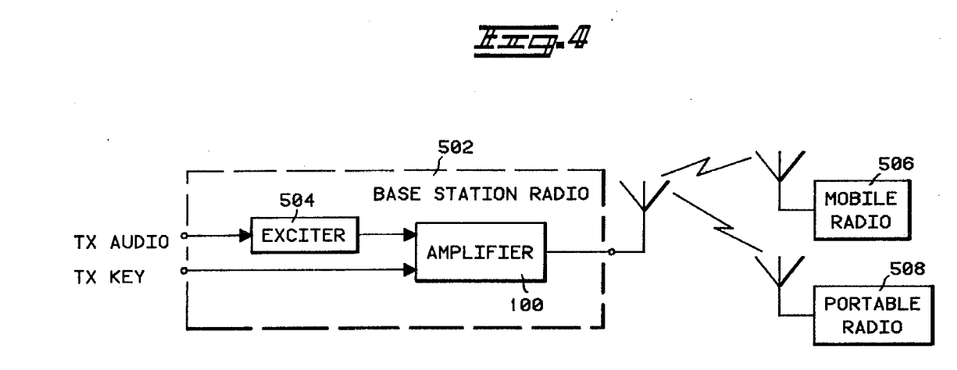
FIG. 4 is a block diagram of a radio communication system which may advantageously utilize the RF signal power amplifier in FIG. 1.
Figure 7A:
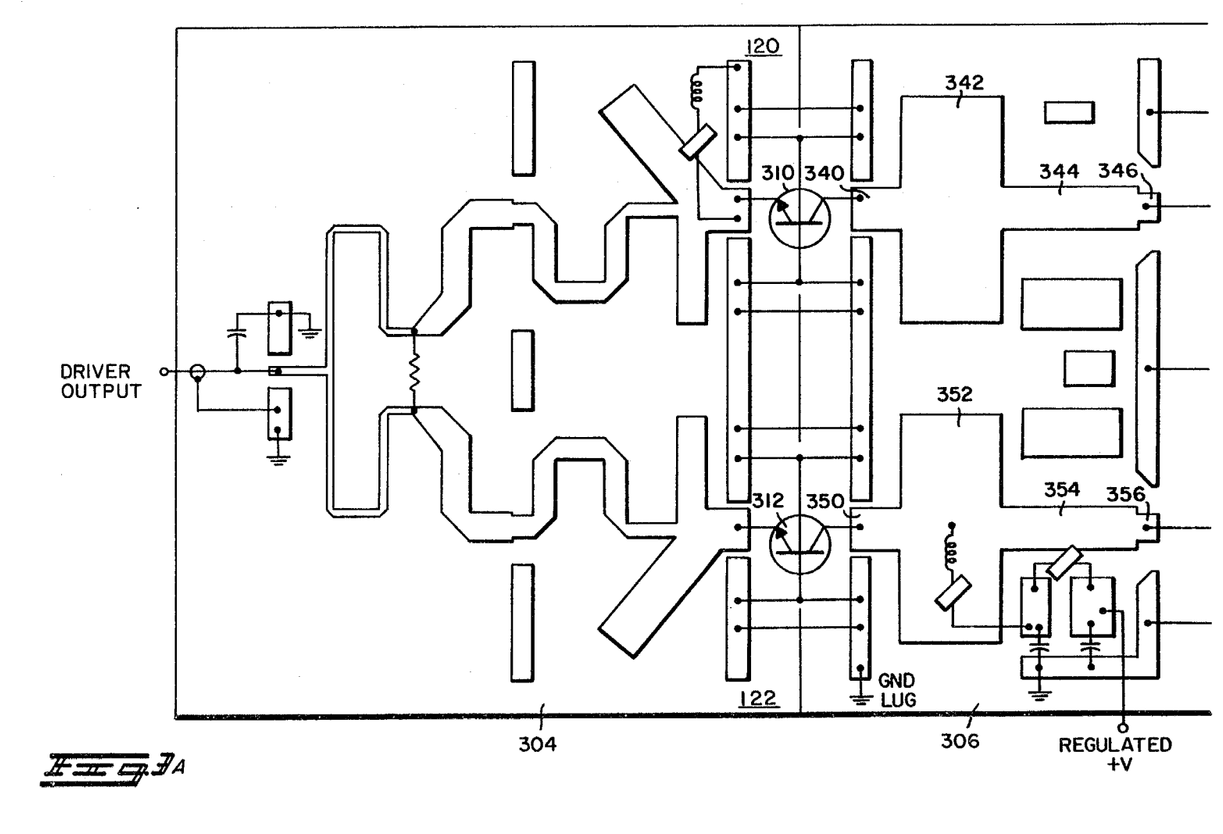

The impedance matching circuitry of the invention is particularly well adapted for use in RF signal power amplifiers in mobile radio communication systems, such as that illustrated in FIG. 4, where amplifier 100, including the inventive impedance matching circuitry, may be utilized in a base station radio 502 for amplifying RF signals modulated by transmitted audio signals in exciter 504. The amplified signals provided by amplifier 100 are coupled to the base station antenna for transmission to mobile radios 506 and portable radios 508 in the mobile radio communication system. Since the amplifier 100 may be enabled and disabled by the transmitter key signal, amplifier 100 may be utilized in mobile radio communication systems where it is desired to enable the amplifier only during the transmission of the transmitte audio signals. For example, amplifier 100 may be advantageously utilized in the base station radio of the mobile radiotelephone communication system described in U.S. Pat. No. 3,906,166.

In summary, a novel impedance matching circuitry for matching an RF signal power amplifier to a predetermined output impedance has been described that utilizes a plurality of series coupled microstrip transmission lines having different characteristic impedances for both impedance matching the power amplifier to the predetermined output impedance and suppressing regenerative oscillatory modes therein. The impedance matching circuitry of the present invention may be advantageously utilized in any RF signal amplifier where it is desirable to stably match the RF signal amplifier to a predetermined output impedance.

I claim:

1. Impedance matching circuitry for radio frequency (RF) signal amplifying means having an input and an output, comprising:
    substrate means having first and second surfaces for receiving plated circuitry thereon, said second surface of the substrate means being plated with a conductive substance for providing a ground plane; and
    a plurality of microstrip transmission line means being disposed on the first surface of the substrate means and coupled in series with one another, said series coupled plurality of microstrip transmission line means further being coupled to the output of said amplifying means for matching the output of said amplifying means to a predetermined output impedance, each of said microstrip transmission line means having different predetermined characteristic impedances whose magnitudes are less than the magnitude of the predetermined output impedance, and each microstrip transmission line means being successively coupled in series to the output of said amplifying means, having a length that is less than one-fourth wavelength of the RF signal and having a greater predetermined characteristic impedance and a longer length than the previously coupled microstrip transmission line means.

2. The matching circuitry according to claim 1, wherein said plurality of microstrip transmission line means includes at least two microstrip transmission lines coupled in series for matching the output of the amplifying means to a predetermined characteristic impedance of 50 ohms.

3. The matching circuitry according to claim 1, or 2, wherein said amplifying means comprises an amplifying stage of a multistage RF signal power amplifier, said matching circuitry matching the output of said amplifying stage to a succeeding amplifying stage of the RF signal power amplifier.

4. The matching circuitry according to claim 3, adapted for use with an RF signal power amplifier of a base station radio in a radio communication system.

5. The matching circuitry according to claim 1, or 4, wherein said amplifying means comprises a multi-transistor amplifying stage of a multistage RF signal power amplifier, said matching circuitry including for each transistor of the multi-transistor amplifying stage a plurality of transmission line means for matching the transistors to a succeeding amplifying stage of the RF signal power amplifier.

6. The matching circuitry according to claim 5, adapted for use with an RF signal power amplifier of a base station radio in a radio communication system.

* * * * *

UNITED STATES PATENT AND TRADEMARK OFFICE
CERTIFICATE OF CORRECTION

PATENT NO. : 4,350,958
DATED : September 21, 1982
INVENTOR(S) : Antonio Pagnamenta It is certified that error appears in the above—identified patent and that said Letters Patent is hereby corrected as shown below:

Claim 5, line 1, delete "4" and insert --2--.

Signed and Sealed this

Fourteenth Day of December 1982

[SEAL]

Attest:

GERALD J. MOSSINGHOFF

Attesting Officer

Commissioner of Patents and Trademarks